United States Patent
Kolar Ranganathan

(10) Patent No.: US 10,067,478 B1
(45) Date of Patent: Sep. 4, 2018

(54) USE OF A RECIRCULATING DELAY LINE WITH A TIME-TO-DIGITAL CONVERTER

(71) Applicant: Silicon Laboratories Inc., Austin, TX (US)

(72) Inventor: Raghunandan Kolar Ranganathan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/837,472

(22) Filed: Dec. 11, 2017

(51) Int. Cl.
*G04F 10/00* (2006.01)
*H03K 3/033* (2006.01)
*H03K 5/1534* (2006.01)
*H03K 5/159* (2006.01)

(52) U.S. Cl.
CPC .......... *G04F 10/005* (2013.01); *H03K 3/033* (2013.01); *H03K 5/159* (2013.01); *H03K 5/1534* (2013.01)

(58) Field of Classification Search
CPC ........ G04F 10/00–10/005; G04F 10/04; G04F 10/06; H03M 1/50; H03M 1/64
See application file for complete search history.

(56) References Cited

U.S. PATENT DOCUMENTS

| 8,564,471 B1 * | 10/2013 | Gao | G04F 10/005 341/155 |
|---|---|---|---|
| 2008/0191921 A1 * | 8/2008 | Scholz | G04F 10/005 341/166 |
| 2010/0283653 A1 * | 11/2010 | Dai | G04F 10/005 341/166 |

FOREIGN PATENT DOCUMENTS

KR 20150112217 A * 10/2015 ............. H03M 1/50

OTHER PUBLICATIONS

Gorbics, M.S., et al., "A High Resolution Multihit Time to Digital Converter Integrated Circuit," IEEE Transactions on Nuclear Science, vol. 44, Issue 3, Jun. 1997, pp. 421-425.
Lee, M. and Abidi, A., "A 9 b, 1.25 ps Resolution Coarse-Fine Time-to-Digital Converter in 90 nm CMOS that Amplifies a Time Residue," IEEE Journal of Solid-State Circuits, vol. 43, Issue 4, 2008, pp. 769-777.
Lin, C. and Syrzycki, M., "Pico-Second Time Interval Amplification," IEEE International SoC Design Conference, 2010, pp. 201-204.
Mota, M., "A High-Resolution Time Interpolator Based on a Delay Locked Loop and an RC Delay Line," IEEE Journal of Solid State Circuits, vol. 34, No. 10, Oct. 1999, pp. 1360-1366.
Mota, M., Design and Characterization of CMOS High-Resolution Time-to-Digital Converters, Universidade Técnica De Lisboa Instituto Superior Técnico, Thesis, 2000, 232 pages.
Oulmane, M. and Roberts, G., "A CMOS Time Amplifier for Femto-Second Resolution Timing Measurement," IEEE International Symposium on Circuits and Systems, vol. 1, 2002, pp. I-509-I-512.

(Continued)

*Primary Examiner* — Howard Williams
(74) *Attorney, Agent, or Firm* — Zagorin Cave LLP

(57) ABSTRACT

The resolution of a time to digital converter (TDC) is improved by using a gain stage at the input of the fine TDC. A delay line receives a pulse corresponding to the time information and recirculates the pulse in the delay line by coupling an output of the delay line to an input of the delay line. An integrating fine TDC receives a number of pulses from the delay line corresponding to the desired gain.

20 Claims, 9 Drawing Sheets

(56) References Cited

OTHER PUBLICATIONS

Räisänen-Ruotsalainen, E. et al., "A Time Digitizer with Interpolation Based on Time-to-Voltage Conversion," Proceedings of 40th Midwest Symposium on Circuits and Systems, vol. 1, 1997, pp. 197-200.

Zhaoxin, M, et al., "Design of a Delay-Locked-Loop-Based Time-to-Digital Converter," Journal of Semiconductors, Chinese Institute of Electronics, Sep. 2013, vol. 34, No. 9, 7 pages.

\* cited by examiner

USE OF A RECIRCULATING DELAY LINE WITH A TIME-TO-DIGITAL CONVERTER

BACKGROUND

Field of the Invention

This disclosure relates to time to digital converters (TDC) and to improvements in the resolution of TDCs.

Description of the Related Art

A Time-to-Digital Converter (TDC) converts the "time" information between two specified events into a digital number in terms of a given time-base. For example, referring to FIG. 1A, the time information Δt represents the elapsed time between EVENT1 and EVENT2. As shown in FIG. 1B, the "time information" Δt in a phase-locked loop (PLL) represents the phase difference between the rising edges of the reference (CLKREF) and feedback clocks (CLKFB). Referring to FIG. 1C, the input pulse width specifies the "time information" in time of flight measurements. Therefore, the two events correspond to the rising and falling edges of the input pulse.

The native resolution ($T_{LSB}$) of the TDC is determined by the smallest measure of the time-base, which represents the smallest unit of time that can be quantified in the system. FIG. 1A illustrates the smallest $T_{LSB}$, where LSB refers to least significant bit. There are various types of time-base(s) with various levels of stability and resolution. For example, the time basis may be the period of the system clock $T_{CLK}$. Using $T_{CLK}$ as a time base provides high stability but poor resolution. Note that a higher frequency system clock can be used for better resolution at the expense of increased power dissipation. In another example, the time base $T_{GATE}$, based on the gate delay of a digital standard cell, such as an inverter or buffer, provides high resolution but poor accuracy as $T_{GATE}$ can be sensitive to process, voltage, and temperature (PVT) variations. In another example a voltage/current-referred time-base ($T_{REF}=C_{REF}V_{REF}/I_{REF}$) provides medium resolution and medium accuracy. Note that the idea here is to obtain a "time reference" using impedances (resistor/capacitor) and a voltage reference (bandgap).

Traditionally, in PLLs, phase delay information between a feedback clock (CLKFB) and a reference clock (CLKREF) is stored in voltage mode by using a phase detector followed by a charge-pump and a capacitor. FIG. 2 illustrates the basic idea. The pulses output from the phase detector 201 control the current sources 203 and 205 to charge/discharge the capacitor C using a fixed current $I_{REF}$, with the polarity of the charge adjustment being determined according to whether CLKFB leads or lags CLKREF. If the phase difference between CLKREF and CLKFB is Δt, the voltage on the capacitor is given by $$V_{OUT} = V_{CM} \pm \frac{I_{REF}\Delta t}{C}.$$

Thus, the capacitor stores the time information (phase delay) as charge. FIG. 3 illustrates a timing diagram associated with the traditional voltage mode approach shown in FIG. 2. A reset mechanism (not shown) is provided to discharge the capacitance between phase comparisons.

Where TDCs are used to convert the time information to digital, TDCs often utilize 2-stages, a coarse TDC and a fine TDC. The coarse TDC typically works with a time base $T_{CLK}$ set by a system clock. The fine TDC is often based on a delay line using N elements with a unit delay of $T_{GATE}$. The delay line may be locked to one period of the time base $T_{CLK}$. The overall resolution is determined by the fine TDC. Improvements in the resolution of the TDC is desirable to achieve a more accurate TDC.

SUMMARY OF EMBODIMENTS OF THE INVENTION

Embodiments disclosed herein improve the resolution of Time-to-Digital Converters (TDCs) by using a gain stage at the input of the TDC. The gain stage uses a "time amplifier" that provides a known fixed PVT invariant gain in the time domain. In embodiments, the time-domain gain is achieved by repetitive addition using a delay line to recirculate time information supplied by way of a pulse, which makes the overall gain PVT invariant.

In an embodiment a method for performing a time to digital conversion includes receiving an input pulse indicative of time information and recirculating a representation of the input pulse in at least one delay line. An output pulse corresponding to the input pulse is generated that is based, at least in part, on a delay line output signal of the at least one delay line. The output pulse is supplied N times to an integrating time to digital converter, where N is an integer greater than one.

In another embodiment an apparatus includes a delay line and input logic coupled to receive an input pulse and coupled to an output of the delay line, the input logic to supply a delay line input signal to the delay line. The delay line recirculates a representation of the input pulse. An integrating time to digital converter is coupled to the delay line to receive N pulse out signals, each pulse out signal corresponding to the input pulse to thereby generate a digital representation of the input pulse multiplied by a gain of N, where N is an integer greater than one.

In another embodiment an apparatus includes a delay line supplying a delay line output signal. A rising edge detector detects a rising edge of an input pulse and supplies a rising edge pulse. A falling edge detector detects a falling edge of the input pulse and generate a falling edge pulse. A first logic circuit logically combines the rising edge pulse, the falling edge pulse, and a feedback signal based on the delay line output signal. A second logic circuit receives an enable signal and an output pulse based on the delay line output signal and passes the output pulse when the enable signal is asserted.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 4A:
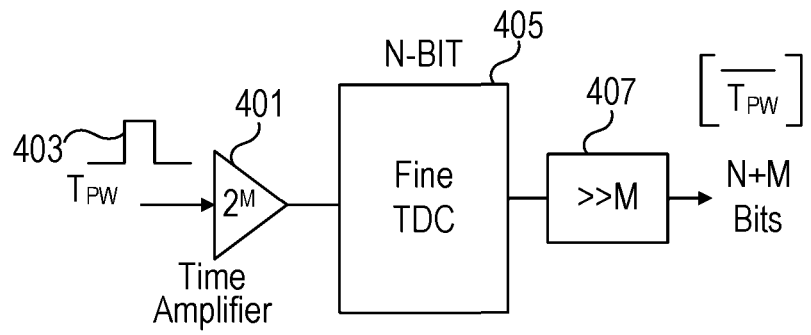
FIG. 4A illustrates a high level block diagram of an embodiment having a gain stage before the fine TDC to improve the effective resolution of the TDC.

The effective resolution ($T_{LSB,eff}$) of the TDC can be improved by adding a gain at the input of the fine TDC prior to its quantization. As shown in FIG. 4A, a gain stage 401 multiplies a pulse 403 having a pulse width $T_{PW}$ and supplies the pulse with gain to an N-bit fine TDC 405. The digital value supplied by TDC 405 is then right shifted in 407 to provide a digital average $\widetilde{T_{PW}}$ that has N+M bits. Thus, for a native resolution of $\widetilde{T_{LSB}}$, and a gain of $2^M$, the effective resolution $\widetilde{T_{LSB,eff}}$ can be determined as follows:

$$\widetilde{T_{PW}} = (2^M T_{PW} + \widetilde{T_{LSB}}) \gg M \Rightarrow \widetilde{T_{PW}} = T_{PW} + \frac{\widetilde{T_{LSB}}}{2} \Rightarrow \widetilde{T_{LSB,eff}} = \frac{\widetilde{T_{LSB}}}{2^M}.$$

Figure 4B:
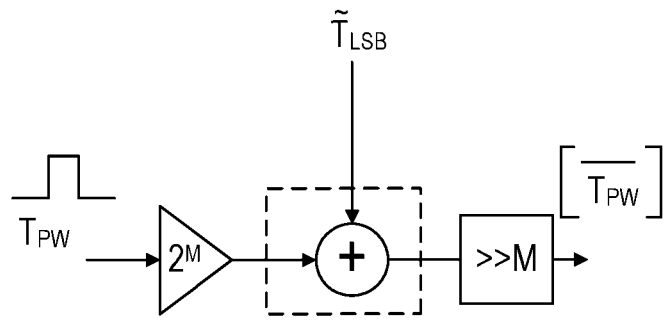
FIG. 4B illustrates another high level block diagram with a gain stage to improve the effective resolution of the TDC.

FIG. 4B illustrates an equivalent view of achieving improved resolution of the fine TDC.

Figure 5:
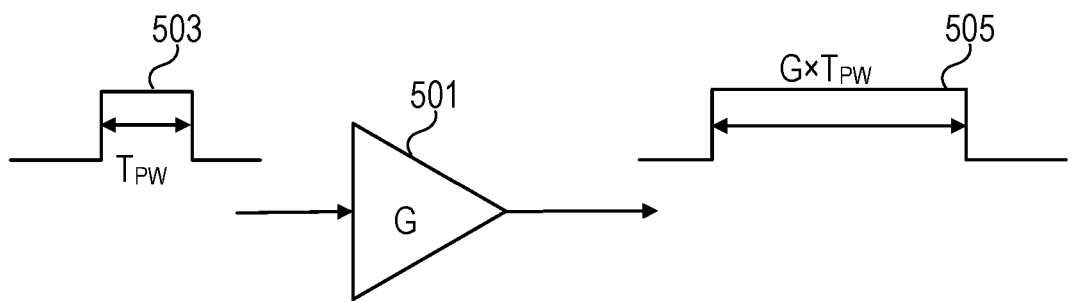
FIG. 5 illustrates a conceptual high level block diagram of a gain stage.

Note that the idea described in FIGS. 4A and 4B requires a "time amplifier" such as shown in FIG. 5. The time amplifier of 501 accepts an input pulse 503 of width $T_{PW}$ and produces an output 505 having a pulse width "G×$T_{PW}$".

Figure 6:
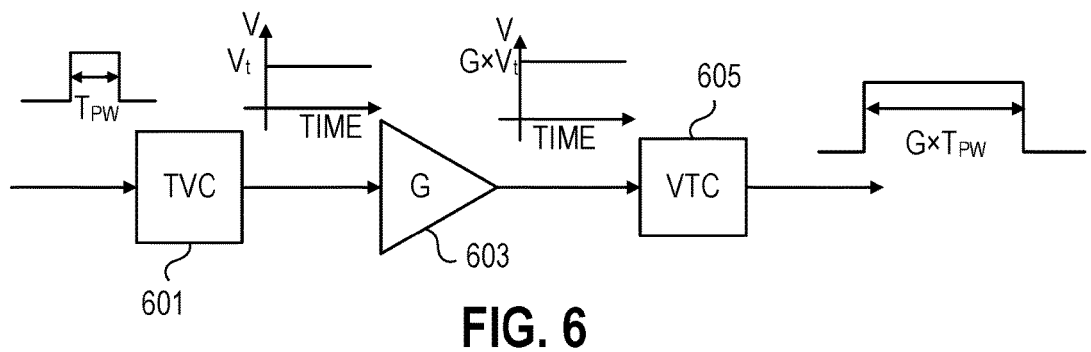
FIG. 6 illustrates a time amplifier circuit that uses a time-to-voltage converter or charge pump followed by a voltage amplifier, followed by a voltage-to-time converter.

Referring to FIG. 6, a time amplifier circuit can be realized by using a time-to-voltage converter (TVC) 601 or charge pump 603 followed by a voltage amplifier (G) 603, followed by a voltage-to-time converter (VTC) 605. Note that the linearity and PVT sensitivity of the TVC, voltage amplifier and VTC affect the overall performance of such a time amplifier. However, the three operations involved cause significant PVT variation in the overall gain. Embodiments described herein avoid the conversion from time to voltage and vice-versa shown in FIG. 6 and the significant PVT variation.

Figure 7:
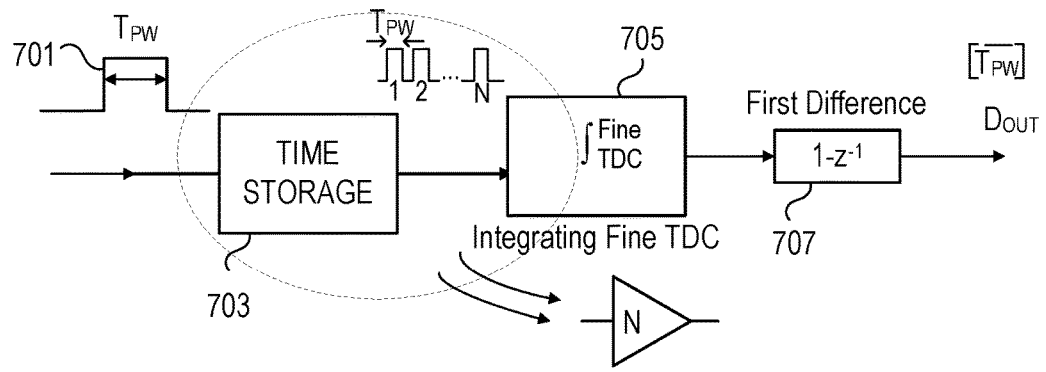
FIG. 7 illustrates a conceptual block diagram of a time amplifier circuit that relies on time information being stored in the system and repeatedly supplied to an integrating fine TDC to achieve the desired gain.

In order to avoid the shortcoming of the time amplifier circuit illustrated in FIG. 6, FIG. 7 illustrates a conceptual block diagram of a time amplifier circuit that relies on time/phase information in pulse 701 being stored in the system in time storage 703 and uses an integrating fine TDC 705 to achieve the required gain. Using the "stored" information, the same input is applied "N-times" to the fine TDC 705. The fine TDC operates in the "integrating mode" where it accumulates the inputs before quantization. The integrated input is finally quantized. Since the quantization occurs after the input is accumulated "N" times, the system is equivalent to an analog gain of "N" followed by the quantizer. For the integrating fine TDC 705, the final output is given by the "first difference" of two successive samples determined in block 707. That allows the errors at the input to be first-order shaped (20 dB/decade) in the frequency domain. Therefore, it is possible to reduce the errors "in-band" by low pass-filtering the digital output. Note that the approach illustrated in FIG. 7 requires a mechanism to "store" information in the time domain, as described further herein.

Figure 1A:
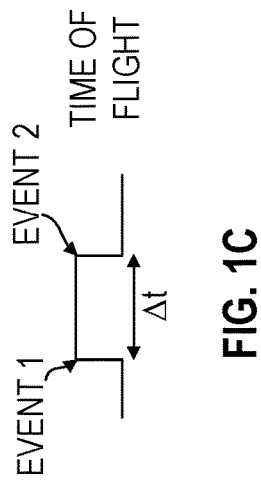
FIG. 1A illustrates time information between two events.
Figure 1B:
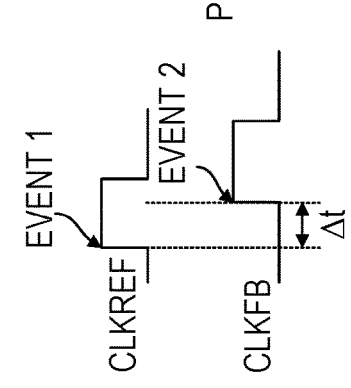
FIG. 1B illustrates the time information corresponding to a phase difference in a PLL.
Figure 1C:
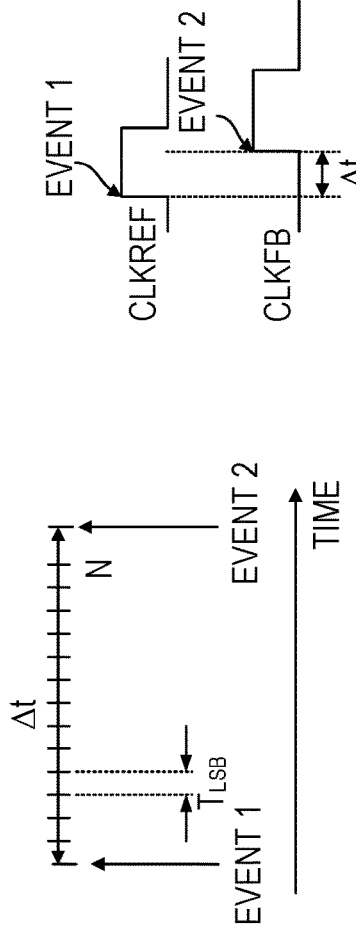
FIG. 1C illustrates time information relating to a time of flight measurement.
Figure 3:
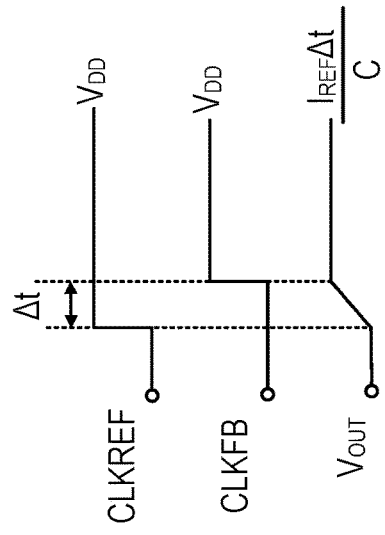
FIG. 3 illustrates a timing diagram associated with the traditional voltage mode approach shown in FIG. 2.
Figure 2:
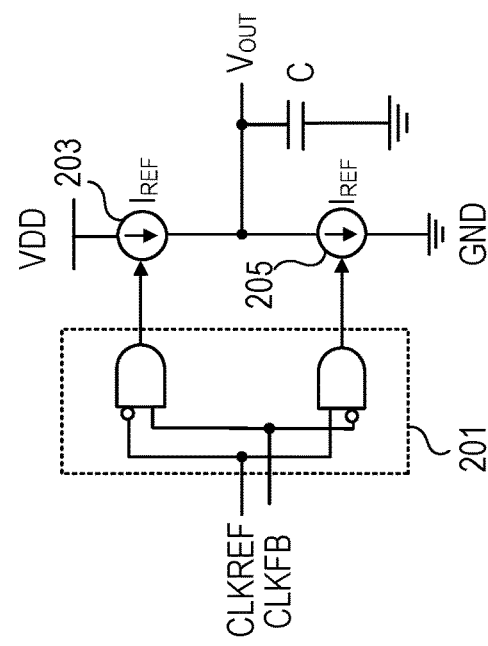
FIG. 2 illustrates how phase delay information between a feedback clock (CLKFB) and a reference clock (CLKREF) in a PLL is stored in voltage mode by using phase detector followed by a charge-pump and a capacitor.

The traditional approach for storing time information as charge as illustrated in FIG. 2 works very well in technologies that provide a large supply voltage VDD and for devices with long channel lengths to realize close to ideal current sources to charge the capacitor. However, scaling the circuit to short channel nodes is not trivial. Capacitor leakage in short channel technologies limits the "retention time" ($t_{ret}$) of voltage, which limits the maximum time-constant that is achievable in the system. For example, the traditional approach cannot be used to design digital PLLs that process phase information at low reference update rates (like 1 pps/1 Hz) that are required in network synchronization. In addition, using longer devices and capacitors requires significant area on chip—which is expensive in short channel process nodes. Advanced process technologies provide high precision in the time domain with small intrinsic gate delays owing to reduced parasitics and shorter channel lengths resulting in large transconductance $g_m$.

Figure 8:
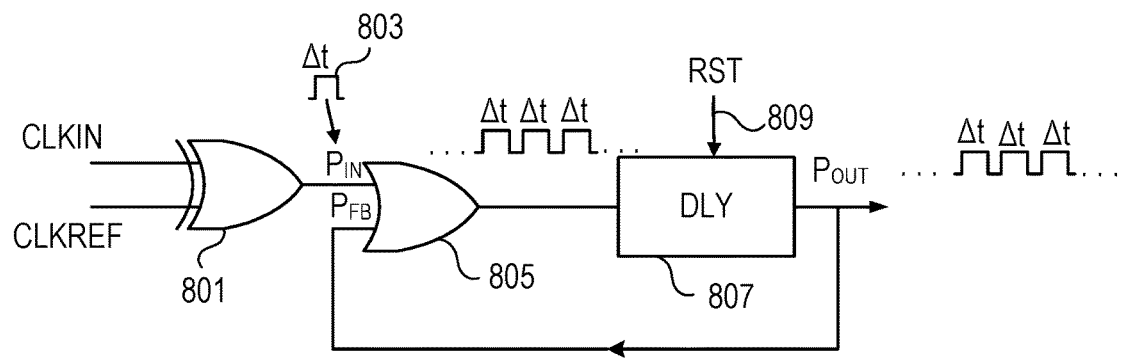
FIG. 8 illustrates how the timing information may be saved as pulses circulating in a delay line.
Figure 9:
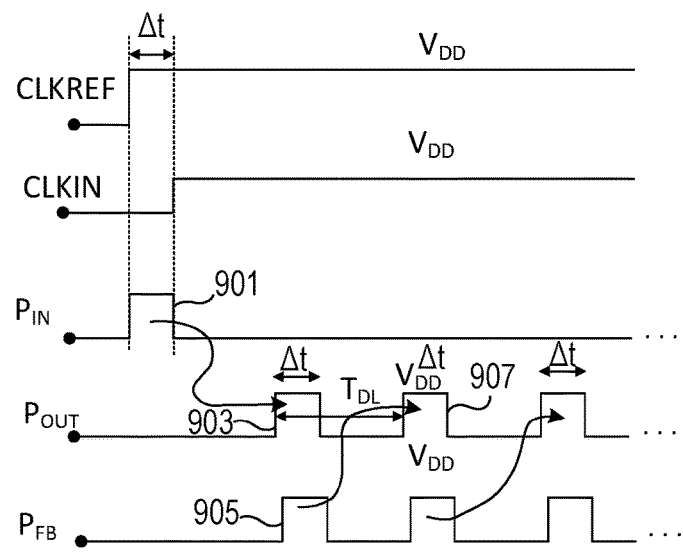
FIG. 9 illustrates a timing diagram associated with recirculating pulses in a delay line.

In order to store the time information, embodiments described herein leverage the high precision available in the time domain to "remember" the phase information as a pulse circulating in a delay line loop. FIGS. 8 and 9 illustrate how the memory information may be supplied and saved as pulses circulating in a delay line rather than being used to turn on a current source as shown in FIG. 2. The XOR gate 801 creates a pulse 803 (shown as $P_{IN}$ in FIG. 9) having a width Δt when the rising edges of CLKIN and CLKREF occur at different times. CLKIN may be, e.g., CLKFB of FIG. 2. While the pulse may represent time information related to a phase difference between clock signals in a PLL, the pulse may more generally represent any time information between two events. The OR gate 805 receives the pulse 803 and supplies the pulse to a delay line 807. The delay line is formed, e.g., by buffers or inverters. The delay line 807 feeds back its output to OR gate 805 to recirculate the pulses.

Referring to FIG. 9, the first pulse enters the delay line at 901 and exits the delay line as $P_{OUT}$ at 903. The output pulse is fed back as $P_{FB}$ and reenters the delay line at 905. That in turn results in pulse out at 907. The pulse is recirculated until a reset signal 809 (FIG. 8) is asserted to reset the delay line, e.g., to force all the stages of the delay line to output a high or low voltage or an appropriate reset condition. Note the assumption that the maximum pulse width of Δt is less than the delay $T_{DL}$ shown in FIG. 9.

Figure 10:
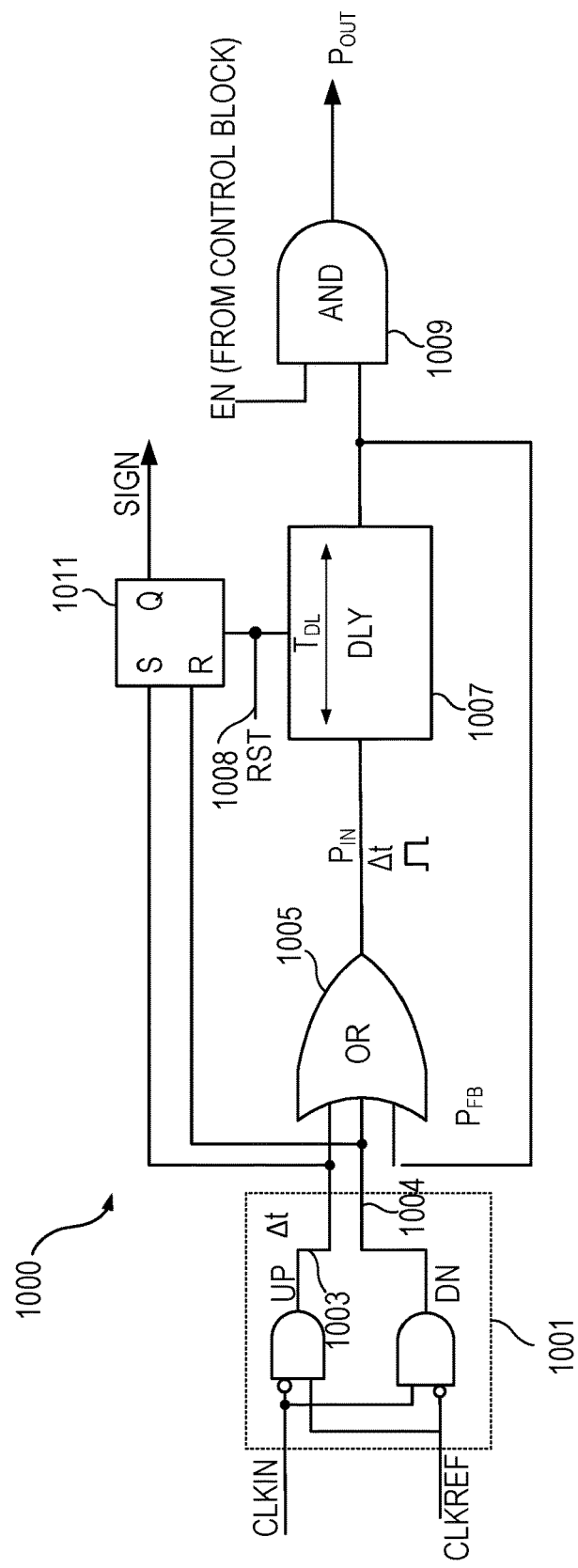
FIG. 10 illustrates an embodiment of a recirculating delay line circuit with a single delay line to store time information that can be used as a time amplification circuit when used in conjunction with an integrator.

FIG. 10 shows an embodiment 1000 similar to the embodiment illustrated in FIG. 8. A conventional phase frequency detector 1001 supplies an UP pulse 1003 and a down (DN) pulse 1004, which are logically combined in OR gate 1005. OR gate 1005 supplies the input pulse $P_{IN}$ to a single delay line 1007 having a delay ($T_{DL}$). The delay line 1007 feeds back its output to OR gate 1005 to form a close-loop system that recirculates the pulses. The S-R latch 1011 generates the sign of Δt, based on the UP and DN pulses. A reset signal (RST) 1008 initializes the system and prepares the system for a next measurement. The delay line supplies the output signal to an AND gate 1009 that gates the pulses from delay line 1007. For example, for a gain value of 5, the enable signal EN supplied by control logic (not shown) is asserted high to allow five pulses through AND gate 1009 and then de-asserted to gate off the pulses when not needed. The phase information from PFD 1001 is preserved as pulse Pout. Note that the approach of FIG. 10 involves the least amount of hardware compared to later described embodiments but is sensitive to mismatch between propagation of rising and falling edges in the delay line.

Figure 11:
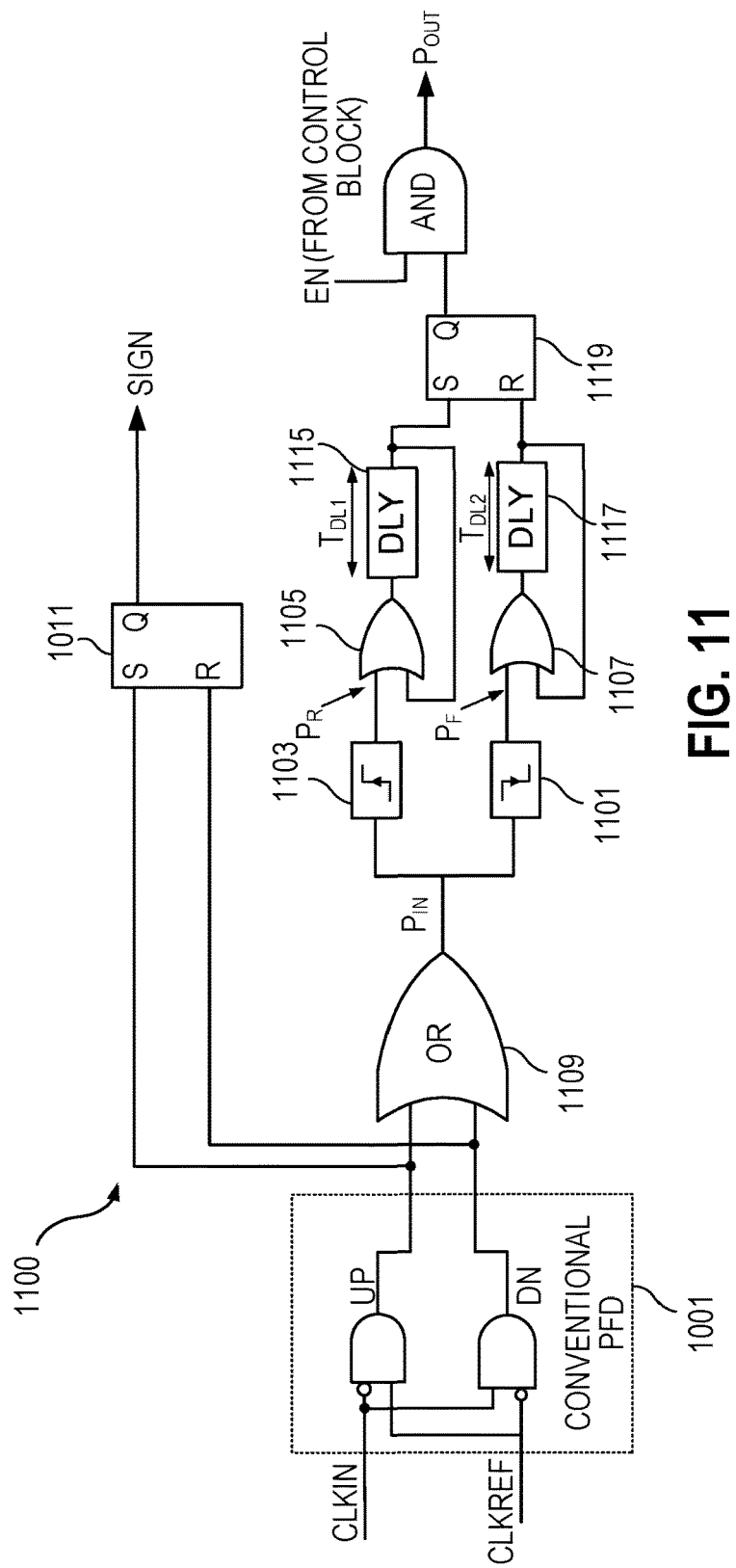
FIG. 11 illustrates an embodiment of a recirculating delay line circuit that circulates pulses in two delay lines to store time information and desensitizes the circuit to delay mismatches between rising and falling edges in the delay lines using edge detect circuits.

FIG. 11 illustrates an embodiment 1100 that desensitizes the circuit to delay mismatches between rising and falling edges in the delay line. The embodiment 1100 uses edge detectors 1101 and 1103 on the input pulse ($P_{IN}$), to generate two pulses corresponding to its rising ($P_R$) and falling ($P_F$) edges respectively. OR gates 1105 and 1107 receive the rising and falling edge pulses, respectively, and feed the pulses into two separate delay lines 1115 and 1117 with delays $T_{DL1}$ and $T_{DL2}$. Thus, the rising and falling edge pulses circulating in the two delay lines represents the input pulse. The second input of each of the OR gates 1105 and 1107 is tied to the output of the corresponding delay line to form a close-loop system that recirculates the rising and falling edge pulses. Appropriate resets (not shown) are provided to initialize the system. Once initialized, the loop will regenerate the pulses over time. An SR latch 1119 receives the output of the delay lines 1115 and 1117 and reproduces the pulse supplied to the delay lines by OR gate 1109. The "EN" signal for the output pulse (Pout), generated by a control block (not shown), allows through the number of pulses corresponding to the desired gain and gates off the pulses when not required. The time information (phase difference in the embodiment of FIG. 11) is preserved as the pulse width of $P_{IN}$ and $P_{OUT}$. The embodiment 1100 is sensitive to delay mismatch between the two delay lines and calibration can be used to correct any mismatch and ensure that $T_{DL1}$ and $T_{DL2}$ are equal.

Figure 12:
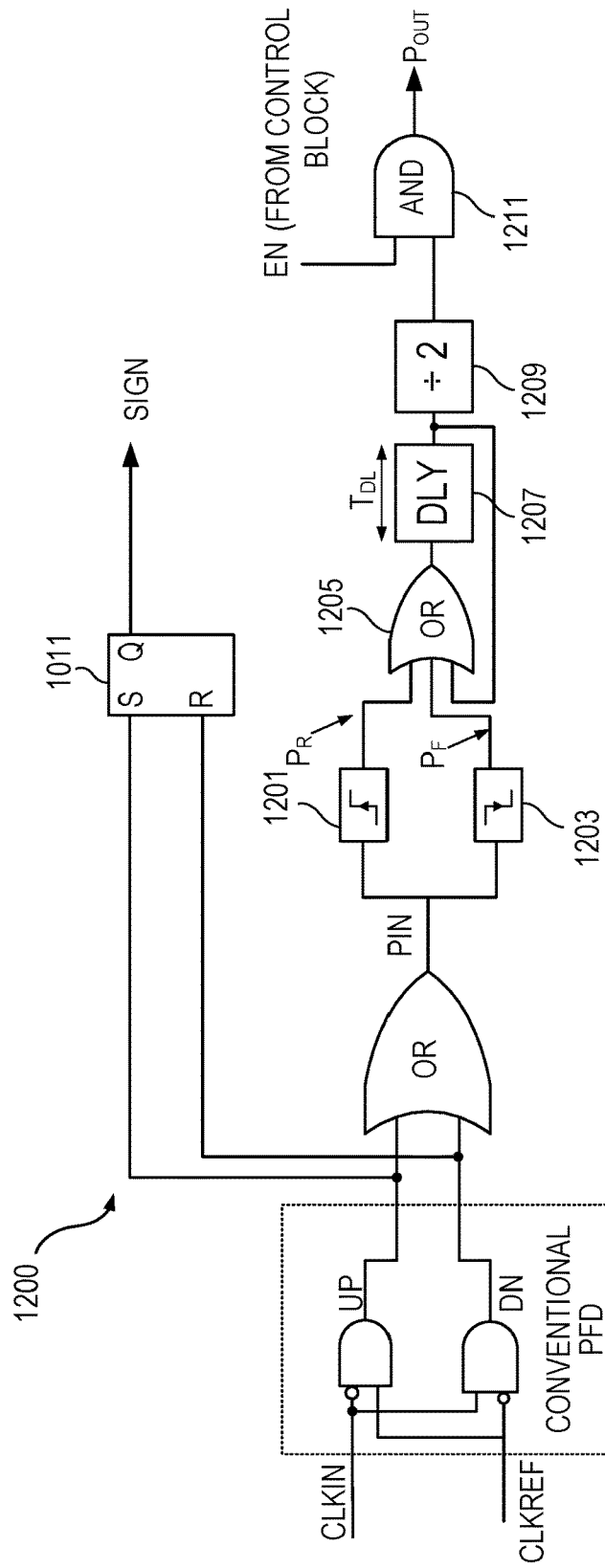
FIG. 12 illustrates an embodiment of a recirculating delay line circuit that stores time information and that alleviates delay mismatch between the two delay lines shown in FIG. 11 by using a single delay line to circulate both the rising edge and falling edge pulses.

FIG. 12 illustrates another embodiment 1200 that alleviates the delay mismatch between the two delay lines shown in embodiment 1100 by using a single delay line 1207 to circulate both the rising edge and falling edge pulses. The embodiment illustrated in FIG. 12 uses edge detectors 1201 and 1203 on the input pulse ($P_{IN}$) to generate two pulses corresponding to its rising ($P_R$) and falling ($P_F$) edges, respectively. OR gate 1205 receives the rising edge pulse and the falling edge pulse and supplies the pulses to the single delay line 1207 with delay ($T_{DL}$). The third input of OR gate 1205 is tied to the output of the delay line 1207 to form a close-loop system that recirculates the pulses. Appropriate resets (not shown) are provided to initialize the system. Once initialized, the loop will regenerate the pulses over time. A divide by two or toggle flip-flop 1209 receives the output of the delay line and reproduces the input pulse based on the rising and falling edge pulses. A control block (not shown) generates the "EN" signal for AND gate 1211 that supplies the output pulse ($P_{OUT}$), to provide an appropriate number of pulses corresponding to a desired gain and to gate-off the pulses when not required. The time (phase) information is preserved as pulse width of $P_{IN}$ and $P_{OUT}$.

Figure 13:
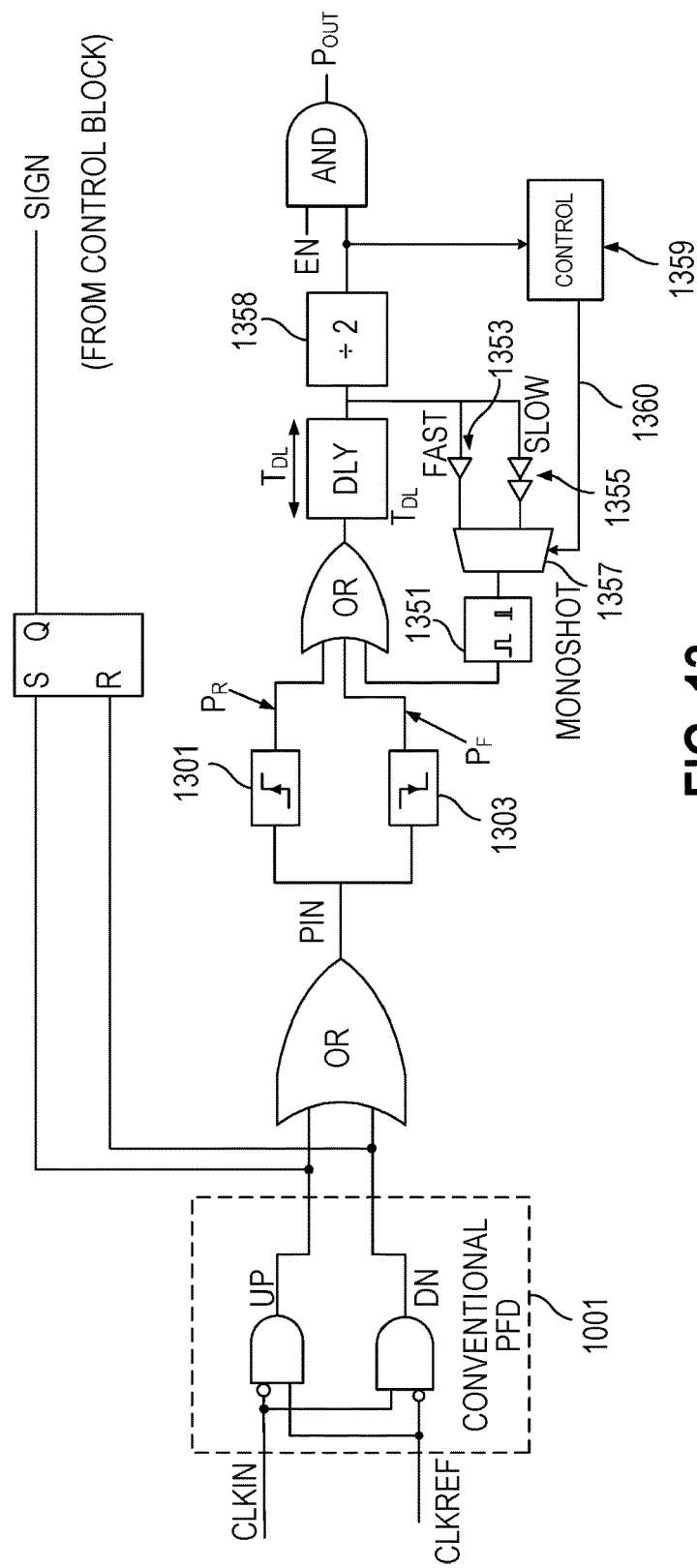
FIG. 13 illustrates an embodiment of a recirculating delay line circuit that stores time information with additional control to provide different delays, if desired, for rising and falling pulses.

FIG. 13 illustrates an embodiment similar to that of FIG. 12 with additional control to provide different delays for odd (rising) and even (falling) pulses. In certain cases, the pulse circulating through the delay line loop can diminish or even disappear because of asymmetric rising and falling edges. FIG. 13 includes the edge detect circuit 1301 and 1303 similar in operation to FIG. 12 and also includes a monostable multivibrator (also referred to herein as a mono-shot or one-shot). The monostable multivibrator 1351 in the feedback path regenerates a pulse with the same pulse width every time the pulse is re-circulated in the loop. Thus, the feedback signal of the delay line can come indirectly from the delay line in the form of the mono-shot pulse or directly from the output of the delay line as shown in, e.g., FIG. 8, 10, 11, or 12. Use of the one-shot ensures that the pulse width doesn't become too small (≈0) or too large (≈$T_{DL}$) due to any systematic errors in the loop. The mono-shot affects both the rising edge pulse and falling edge pulse in the same way. The mono-shot "extends" the pulses (both the rising and falling edge pulses) by delaying one of the edges of the individual pulses. In other words, mono-shot ensures that the pulse width of each of the two pulses is restored to a constant value ("$T_{monoshot}$"). The actual information between two successive rising (or falling) edges of the pulses is not impacted by the mono-shot.

The embodiment also includes an optional fast delay path 1353 and slow delay path 1355 formed, e.g., by buffers, that can be used to adjust the pulse width. A multiplexer 1357 selects the fast delay path or the slow delay path based on a select signal from control logic. The control logic 1359 determines whether to increase the pulse or decrease the pulse width. For example, the control logic may increase the pulse width by delaying the falling edge pulse in the slow path 1355 while the rising edge pulse width uses the fast path 1353. Alternatively, the control logic may decrease the pulse width by utilizing the slow path for the rising edge pulse and the fast path for the falling edge path. The control logic determines whether an edge is rising or falling based on whether it is odd or even.

The control logic 1359 that selects the fast or the slow path can be configured to "modulate" the pulse width in the loop. The actual operation depends on how the user wants the pulse width to change with time. Note that using this approach, the phase delay information can be made to be larger/smaller or monotonically increase/decrease by providing different delays in the feedback path. That can be used for noise shaping in a sigma delta loop.

For example, if the user wants the pulse width to monotonically increase, the control logic selects the "fast" path for the rising pulse and the "slow" path for the falling pulse. For that embodiment the control logic has a toggle flip-flop (not shown) clocked by the output of Div-by-2 1358 to control the select line 1360 to the multiplexer 1357. Such a control is useful in a pulse width modulation systems. Note that an extension of this control with a DTC (digital-to-time converter) can also be used to create a successive approximation register (SAR) TDC. In another embodiment, the control logic uses a pseudo-random bit sequence (PRBS) to randomize the selection of the fast/slow paths, which helps in mitigating spurs arising due to deterministic edges of the pulse for a given input.

Figure 14:
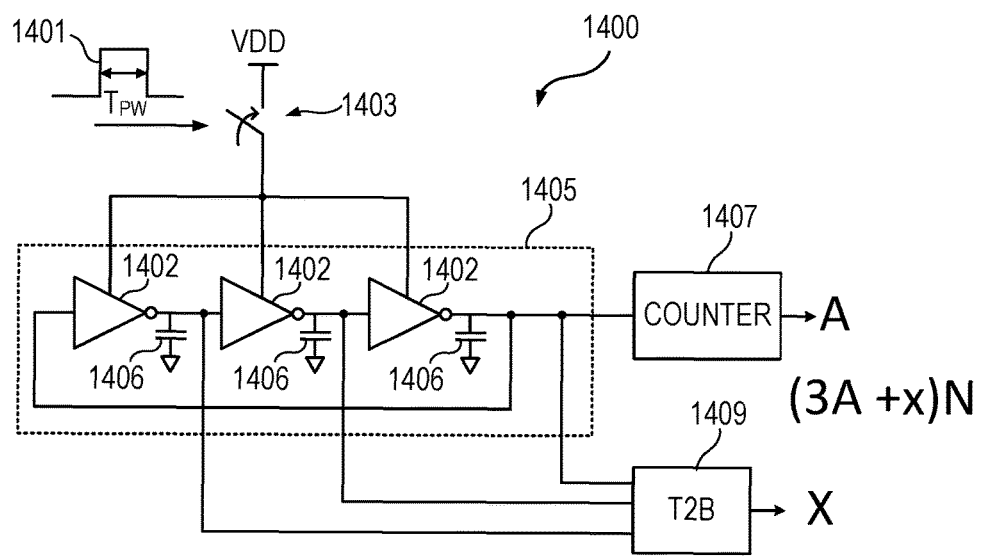
FIG. 14 illustrates an embodiment of an integrating fine TDC that may be used in conjunction with a recirculating delay line circuit to provide time amplification and increased effective resolution.

FIG. 14 illustrates an embodiment of an integrating fine TDC 1400 using three delay line elements 1402. The pulse 1401 supplied by the pulse recirculating gain circuit controls a switch 1403. When the pulse 1401 is asserted, the switch closes and power is supplied to the delay line 1405 causing a pulse to circulate in the delay line for the duration of the pulse 1401. The circuit shown in FIG. 14 is also known as a gated ring-oscillator (GRO). Here the ring oscillator continues to oscillate as long as the switch (1403) is closed by the pulse 1401 and freezes/stops when the switch is opened when the pulse is low. The number of pulses through the delay line 1405 is captured in counter 1407. When the pulse 1401 de-asserts, the thermometer to binary (T2B) decoder 1409 supplies the value of each stage of the delay line as value X. Thus, the value determined is 3A+X for each pulse 1401.

The multiplication by 3 can be understood as follows. Assume the number of times the GRO has "rolled over" is "A", then the "effective" number of delay units that toggled during the time the switch (1403) was asserted is given by 3*A+X. Here the term 3*A corresponds to the total delay of "3" unit cells rolling over "A" times. To provide gain, the pulse recirculating gain circuit, examples of which are shown in FIGS. 8, 10, and 11-13, supplies pulse 1401 N times resulting in a gain of N or N(3A+X).

In embodiments, the initial state of the delay line can be arbitrary. That is, the GRO can start from any initial state (as long as it is recorded as the initial state). Starting from an arbitrary state works because the "final" output is taken as the difference of the final and the initial state ($1^{st}$ difference) in embodiments. See, e.g., 707 in FIG. 7. Note that this "barrel-shifting" operation provides $1^{st}$ order mismatch shaping for the delay mismatch between the units. The capacitors 1406 in delay line 1405 ensure that the next pulse 1401 to be integrated starts with the delay line 1405 in the same state as when it left off. That assumes that the next pulse from the recirculating delay line arrives before the capacitors have significantly discharged. The key is that the state of the GRO is "frozen" in between the N re-circulations. So the GRO "virtually" sees a pulse that is N times the input pulse width. The number of delay units 1403 is usually chosen to minimize the rollover frequency so that the number of rollovers (A) can be accurately captured using digital circuitry, which includes the counter and the thermometer to binary encoder. The number "3" shown in FIG. 14 is for illustration. As mentioned above, the internal state of the GRO is frozen in between the conversions—in other words, the partial residue on the capacitors of the unit cells is assumed to be "held" before the next pulse from the recirculation arrives. That ensures that the GRO is operating as an integrating TDC, where integration is used to provide gain.

Figure 15:
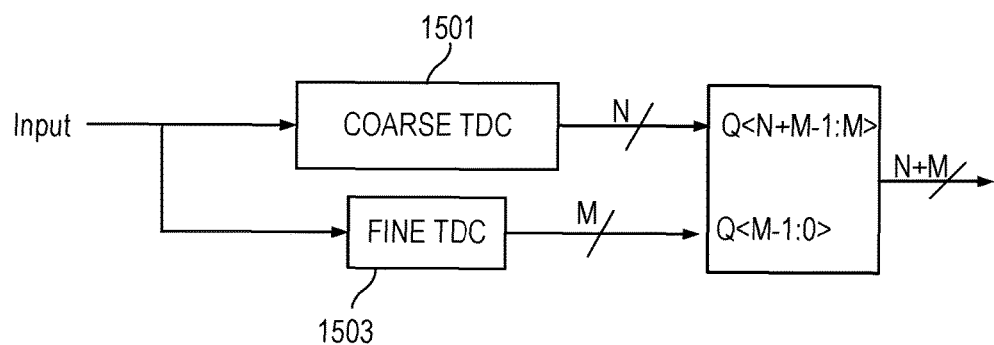
FIG. 15 illustrates a high level block diagram of a TDC with a coarse TDC and a fine TDC.

FIG. 15 shows a high level block diagram of a TDC that uses a coarse TDC 1501 and a fine TDC 1503 that provides improved effective resolution using recirculation of input pulses as described above. The coarse TDC may be, e.g., a ripple counter. The fine TDC 1503 includes one of the recirculating delay lines described above in conjunction with an integrating delay line described, e.g., in FIG. 14. In the example of FIG. 15, the coarse TDC provides N coarse bits, e.g., 24 bits, and the fine TDC provides M bits, e.g., 8 fine bits.

Thus, various aspects have been described relating to improving the resolution of TDCs. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method for performing a time to digital conversion comprising:
   receiving an input pulse indicative of time information;
   recirculating a representation of the input pulse in at least one delay line;
   generating an output pulse corresponding to the input pulse based, at least in part, on a delay line output signal of the at least one delay line; and
   supplying the output pulse N times to an integrator, where N is an integer greater than one.

2. The method as recited in claim 1 wherein recirculating the representation of the input pulse in the at least one delay line further comprises:
   logically combining a first input signal to the at least one delay line with a second input signal based on the delay line output signal.

3. The method as recited in claim 1 further comprising:
   selectively supplying the output pulse to the integrator N times according to an enable signal.

4. The method as recited in claim 1 further comprising:
   determining a polarity of the input pulse.

5. The method as recited in claim 1 further comprising:
   detecting a rising edge of the input pulse and generating a rising edge pulse;
   detecting a falling edge of the input pulse and generating a falling edge pulse;
   logically combining a feedback signal based on the delay line output signal and at least the rising edge pulse to generate a delay line input signal; and
   supplying the delay line input signal to an input of the at least one delay line.

6. The method as recited in claim 5 further comprising selecting one of a first delay path and a second delay path in a feedback path coupled between the delay line output signal and the input of the at least one delay line.

7. The method as recited in claim 5 further comprising logically combining the feedback signal based on the delay line output signal, the rising edge pulse, and the falling edge pulse to generate the delay line input signal.

8. The method as recited in claim 7 further comprising dividing the delay line output signal by two to generate output pulse.

9. An apparatus comprising:
   a delay line;
   input logic coupled to receive an input pulse and coupled to receive an output of the delay line, the input logic to supply a delay line input signal to the delay line, wherein a representation of the input pulse is recirculated in the delay line; and
   an integrating time to digital converter coupled to the delay line to receive N pulse out signals, each pulse out signal corresponding to the input pulse to thereby generate a digital representation of the input pulse multiplied by a gain of N, where N is an integer greater than one.

10. The apparatus as recited in claim 9 wherein the input logic comprises an OR gate to logically combine the delay line input signal with a feedback signal corresponding to the output of the delay line to recirculate the input pulse.

11. The apparatus as recited in claim 10 further comprising:
- a first delay path and a second delay path in a feedback path between the output of the delay line and the input logic; and
- a selector circuit to select the first or the second delay path.

12. The apparatus as recited in claim 10 further comprising:
- a monostable multivibrator circuit coupled to the output of the delay line to generate the feedback signal.

13. The apparatus as recited in claim 9 further comprising:
output logic coupled to an output of the delay line to supply a pulse out signal according to an enable signal.

14. The apparatus as recited in claim 9 further comprising:
sign logic to determine a polarity of the input pulse and supply a sign indication.

15. The apparatus as recited in claim 9 further comprising:
- a rising edge detector to detect a rising edge of the input pulse and supply a rising edge pulse;
- a falling edge detector to detect a falling edge of the input pulse and generate a falling edge pulse; and
- a logic circuit to logically combine a feedback signal based on the output of the delay line, the rising edge pulse, and the falling edge pulse to generate the delay line input signal.

16. The apparatus as recited in claim 15 further comprising a divide by two circuit to divide the output of the delay line by two to generate a pulse out signal.

17. The apparatus as recited in claim 16 further comprising a gating circuit to selectively pass the pulse out signal N times according to an enable signal, to thereby effectively supply the input pulse N times to the integrating time to digital converter.

18. The apparatus as recited in claim 9 further comprising:
- a second delay line;
- a rising edge detector to detect a rising edge of the input pulse and supply a rising edge pulse;
- a falling edge detector to detect a falling edge of the input pulse and generate a falling edge pulse;
- a first logic circuit to logically combine an output of the delay line and the rising edge pulse to generate the delay line input signal;
- a second logic circuit to logically combine an output of the second delay line and the falling edge pulse to generate a second delay line input signal; and
- a logic circuit to combine the output of the delay line and the output of the second delay line into an output pulse supplied to the integrating time to digital converter as the representation of the input pulse.

19. An apparatus comprising:
- a delay line supplying a delay line output signal;
- a rising edge detector to detect a rising edge of an input pulse and supply a rising edge pulse;
- a falling edge detector to detect a falling edge of the input pulse and generate a falling edge pulse;
- a first logic circuit to logically combine the rising edge pulse, the falling edge pulse, and a feedback signal based on the delay line output signal; and
- a second logic circuit coupled to receive an enable signal and an output pulse based on the delay line output signal and to pass the output pulse when the enable signal is asserted.

20. The apparatus as recited in claim 19 comprising:
- a divide by two circuit coupled to receive the delay line output signal and supply the output pulse to the second logic circuit.

* * * * *